US008132063B2

(12) United States Patent
Terao et al.

(10) Patent No.: US 8,132,063 B2
(45) Date of Patent: Mar. 6, 2012

(54) SEMICONDUCTOR DEVICE

(75) Inventors: Motoyasu Terao, Hinode (JP); Satoru Hanzawa, Hachioji (JP); Hitoshi Kume, Musashino (JP); Minoru Ogushi, Kodaira (JP); Yoshitaka Sasago, Tachikawa (JP); Masaharu Kinoshita, Kokubunji (JP); Norikatsu Takaura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/191,442

(22) Filed: Jul. 26, 2011

(65) Prior Publication Data

US 2011/0283039 A1 Nov. 17, 2011

Related U.S. Application Data

(63) Continuation of application No. 12/469,778, filed on May 21, 2009, now Pat. No. 7,996,735.

(30) Foreign Application Priority Data

Aug. 29, 2008 (JP) ................................. 2008-220785

(51) Int. Cl.
*G11C 29/00* (2006.01)
(52) U.S. Cl. ........................ 714/721; 365/201
(58) Field of Classification Search .................. 365/201, 365/163; 369/95; 257/2; 714/718, 42, 721
See application file for complete search history.

(56) References Cited

U.S. PATENT DOCUMENTS

| 5,254,382 | A | 10/1993 | Ueno et al. |
| 5,357,473 | A * | 10/1994 | Mizuno et al. ............... 365/201 |
| 5,883,827 | A | 3/1999 | Morgan |
| 7,075,140 | B2 | 7/2006 | Spadea |
| 7,438,965 | B2 | 10/2008 | Ohkura et al. |
| 7,573,058 | B2 | 8/2009 | Noh et al. |
| 7,692,979 | B2 | 4/2010 | Fuji et al. |
| 7,777,213 | B2 | 8/2010 | Kang et al. |
| 7,782,731 | B2 * | 8/2010 | Henrichs .......................... 369/95 |
| 2002/0019959 | A1 * | 2/2002 | Harada ............................ 714/42 |

(Continued)

FOREIGN PATENT DOCUMENTS

JP 2002-109797 A 4/2002

(Continued)

OTHER PUBLICATIONS

Stefan Lai et al, "OUM—A 180 nm Nonvolatile Memory Cell Element Technology for Stand Alone and Embedded Applications", IEEE, IEDM pp. 803-806, 2001.

(Continued)

*Primary Examiner* — David Ton
(74) *Attorney, Agent, or Firm* — Miles & Stockbridge P.C.

(57) ABSTRACT

To realize a fast and highly reliable phase-change memory system of low power consumption, a semiconductor device includes: a memory device which includes a first memory array having a first area including a plurality of first memory cells and a second area including a plurality of second memory cells; a controller coupled to the memory device to issue a command to the memory device; and a condition table for storing a plurality of trial writing conditions. The controller performs trial writing in the plurality of second memory cells a plurality of times based on the plurality of trial writing conditions stored in the condition table, and determines writing conditions in the plurality of first memory cells based on a result of the trial writing. The memory device performs writing in the plurality of first memory cells based on the writing conditions instructed from the controller.

5 Claims, 15 Drawing Sheets

U.S. PATENT DOCUMENTS

| | | |
|---|---|---|
| 2003/0002367 A1 | 1/2003 | Hong et al. |
| 2007/0248785 A1 | 10/2007 | Nakai et al. |
| 2009/0073753 A1 | 3/2009 | Osada et al. |
| 2009/0287957 A1* | 11/2009 | Bilger et al. ............... 714/8 |

FOREIGN PATENT DOCUMENTS

| | | |
|---|---|---|
| JP | 2003-100991 A | 4/2003 |
| JP | 2005-050424 A | 2/2005 |
| KR | 2003-0002419 A | 1/2003 |

OTHER PUBLICATIONS

Martijn H.R. Lankhorst et al, "Low-cost and nanoscale non-volatile memory concept for future silicon chips", Nature Materials, vol. 4, pp. 347-352, 2005.

Myoung-Jae Lee et al, "2-Stack 1D-1R Cross-point Structure with Oxide Diodes as Switch Elements for High Density Resistance RAM Applications", IEEE, IEDM pp. 771-774, 2007.

* cited by examiner

| RESET CONDITION | CURRENT SELECTION SIGNAL | | | RESET CURRENT Irst |
|---|---|---|---|---|
| | LS3B | LS2B | LS1B | |
| A | 1 | 1 | 1 | Irst0 |
| B | 1 | 1 | 0 | $(m+1) \times$ Irst0 |
| C | 1 | 0 | 1 | $(k+1) \times$ Irst0 |
| D | 0 | 1 | 1 | $(j+1) \times$ Irst0 |

$j>k>m$

| SETTING TIME (ns) | | |
|---|---|---|
| | 500 | TRY_U:UNNECESSARY<br>TRY_M:UNNECESSARY<br>TRY_L:UNNECESSARY |
| | 600 | TRY_U:UNNECESSARY<br>TRY_M:UNNECESSARY<br>TRY_L:UNNECESSARY |
| | 700 | TRY_U: UNEXECUTED<br>TRY_M: UNEXECUTED<br>TRY_L: UNEXECUTED |
| | 800 | TRY_U: UNEXECUTED<br>TRY_M: UNEXECUTED<br>TRY_L: UNEXECUTED |
| | 900 | TRY_U: UNEXECUTED<br>TRY_M: UNEXECUTED<br>TRY_L: UNEXECUTED |
| | 1,000 | TRY_U: UNEXECUTED<br>TRY_M: UNEXECUTED<br>TRY_L: UNEXECUTED |

*FIG. 9*

SEMICONDUCTOR DEVICE

CROSS-REFERENCE TO RELATED APPLICATION

This application is a continuation of application Ser. No. 12/469,778 filed May 21, 2009 now U.S. Pat. No. 7,996,735.

CLAIM OF PRIORITY

The present application claims priority from Japanese patent application JP2008-220785 filed on Aug. 29, 2008, the content of which is hereby incorporated by reference into this application.

BACKGROUND OF THE INVENTION

This invention relates to a semiconductor device, and more particularly, to a nonvolatile semiconductor memory system such as a phase-change memory or a phase-change random access memory (RRAM), and its controller.

There are a phase-change memory and a phase-change optical disk as recording technologies which use physical properties of chalcogenide materials. As phase-change materials used therefor, chalcogenide materials including tellurium (Te) are known.

U.S. Pat. No. 5,254,382 discloses an optical disk medium which uses, for a storage layer, a chalcogenide material represented by $[(Ge_yTe_{1-y})_a(Sb_zTe_{1-z})_{1-a}]_{1-b}(In_{1-x}Te_x)_b$ (in this case, $0.4 \leq y \leq 0.6$, $0.3 \leq z \leq 0.6$, $0.4 \leq z \leq 0.6$, $0.1 \leq a \leq 0.5$, $0.01 \leq b \leq 0.3$). This chalcogenide material contains In (indium) added to Ge (germanium)-Sb (antimony)-Te for the purpose of increasing stability of an amorphous state to improve long data-retention while maintaining characteristics which enable fast crystallization.

U.S. Pat. No. 5,883,827 discusses a nonvolatile memory which uses a chalcogenide material film. This nonvolatile memory is a phase-change memory in which stored information is written by a change of atomic arrangement of a phase-change material film made according to Joule heat by a current flowing through the phase-change material film itself and a cooling speed. For example, in the case of setting an amorphous state, a temperature exceeding 600° C. with Joule heat is added to the phase-change material film to melt the phase-change material film. Thus, while an operation current easily becomes large, a resistance value changes by 2 to 3 orders of magnitude depending on a state.

Concerning the electric phase-change memory, studies have been pursued mainly on those using a chalcogenide $Ge_2Sb_2Te_5$. For example, JP 2002-109797 A discloses a recording element which uses $Ge_2Sb_2Te_5$. JP 2003-100991 A discloses a technology regarding a memory which uses a chalcogenide material. IEEE International Electron Devices meeting, TECHNICAL DIGEST, 2001, p. 803 to 806 describes rewritability of $10^{12}$ times at a phase-change memory which uses a phase-change film containing $Ge_2Sb_2Te_5$. Nature Materials, Vol. 4, 2005, p. 347 to 351 discloses a technology regarding a phase-change memory which uses a crystal-growth-type material.

JP 2005-050424 A discusses, to deal with characteristic variances among memory elements, a method of performing rewriting with pulses suited to the memory elements by carrying out trial writing for the respective memory elements.

Additionally, there is known a memory element called RRAM in which an electrode of Au (gold), Ag (silver), Cu (copper), Ni (nickel), or Zn (zinc) is formed adjacently to a film of a material containing an oxide, Se (selenium), or S (sulfur). IEEE International Electron Devices meeting, TECHNICAL DIGEST, 2007, P. 771 to 774 describes an application example of a diode to an element for selecting a memory element to reduce a memory cell area. Circuit operations are similar, and hence the diode can be applied to the phase-change memory or a PRAM.

A characteristic operation of a sensor network is an intermittent operation. This operation drives necessary hardware only when a task such as sensing or data transmission is executed, completely stops peripheral hardware when there is no task to be executed, and causes a microcomputer to sleep in a low-power mode. The intermittent operation enables the controller to operate with low power consumption for a long period of time.

SUMMARY OF THE INVENTION

High performance can be expected of the phase-change memory. However, characteristics often vary largely among the memory elements because of use of materials with the amorphous state of multicomponents relatively stable. Pre-checking characteristics of the memory elements enables rewriting under optimal conditions as described in JP 2005-050424 A. However, this process is not practical, because it takes an extremely long period of time, and the memory is used for storing optimal conditions different from one element to another.

The phase-change memory tends to easily change in memory characteristics due to an influence of heat history. Thus, the cycle of verify-readings may be increased, disabling sufficient exhibition of high-speed performance. In this case, a temperature difference and a film thickness difference between a wafer center and a peripheral portion are also influencing factors.

Influencing factors of rewriting conditions are as follows.
1. Substrate temperature during film formation . . . average value and uneven temperature
2. Temperature condition during interlayer insulating film formation
3. Annealing condition during select diode formation
4. Ambient temperature (or influence of thermal conduction from neighboring device):
    . . . how many times data has been rewritten at what temperature
    . . . resistance changes when a temperature changes, and an applied voltage (so-called threshold voltage) necessary for changing from a high-resistance state to a low-resistance state changes
5. Past number of rewriting operations
    . . . as the number of rewriting operations becomes larger, the setting (to low-resistance state) becomes easier An object of this invention is to provide a memory system which can solve the problems with the conventional art, and perform a stable operation by dealing with variances or fluctuations.

A re-write area is a kind of sensor for detecting an representative condition of a memory, and includes a single or a plurality of areas. These areas are formed in a memory chip, and thus transmit no information as in the case of the conventional memory. Thus, polling, in other words, a controller command, is necessary to execute trial writing or reading.

Similarly, in the case of a DVD-RAM based on a phase change as a storage principle, trial writing has conventionally been executed in a trial writing-only area. However, in a semiconductor phase-change memory, when a system of trial writing in a trial writing-only area is employed, it is important to deal with an easy increase in difference in number of executed writing operations between the memory area and the re-write area.

This invention has been developed in view of the aforementioned problems. An object of this invention is to provide a technology for realizing data writing/rewriting with small variance or no fluctuation in a data memory area by trial writing, and low power consumption of a controller.

A simple outline of a representative aspect of this invention disclosed herein is as follows.

A semiconductor device comprising: a memory device which includes a first memory array having a first area including a plurality of first memory cells and a second area including a plurality of second memory cells; a controller coupled to the memory device to issue a command to the memory device; and a table of condition management for storing a plurality of trial writing conditions, wherein: the controller performs trial writing in the plurality of second memory cells a plurality of times based on the plurality of trial writing conditions stored in the table of condition management, and determines writing conditions in the plurality of first memory cells based on a result of the trial writing; and the memory device performs writing in the plurality of first memory cells based on the writing conditions instructed from the controller.

The embodiment of this invention improves a yield of a memory element, a memory device or a memory system, and greatly reduces the cycle of verify-readings or eliminates verification. Thus, an effective data transfer speed can be increased. Low power consumption can be realized. Moreover, operation conditions are optimized as occasion demands during use by a user, and hence a highly reliable memory system can be built.

BRIEF DESCRIPTION OF THE DRAWINGS

FIG. 9 illustrates an example of the condition table illustrated in FIG. 1.

DETAILED DESCRIPTION OF THE PREFERRED EMBODIMENTS

Figure 1:
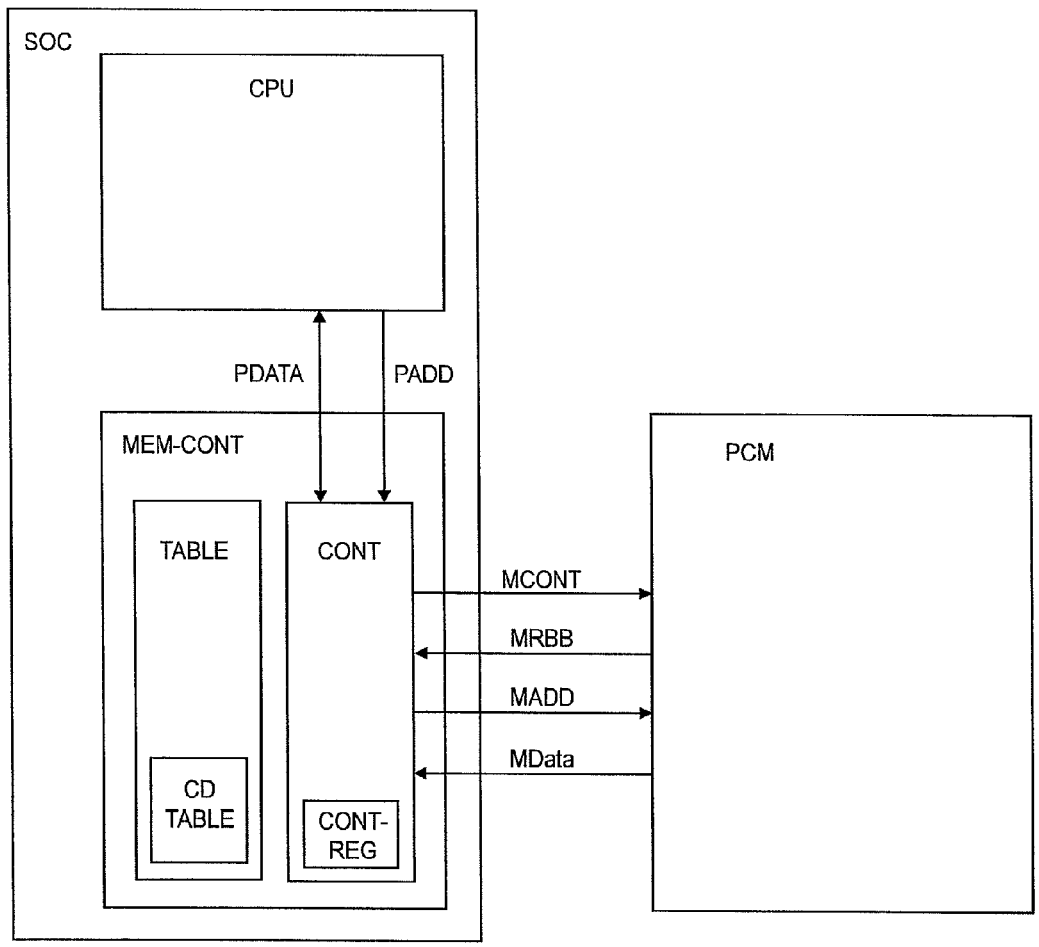
FIG. 1 illustrates an example of a configuration of a phase-change memory system in a semiconductor device according to a first embodiment of this invention.

Referring to the drawings, the preferred embodiments of this invention are described in detail below. In all the drawings illustrating the embodiments, identical members are denoted by identical reference numerals in principle to avoid repeated description thereof. Though not particularly limited, a circuit element constituting each function block of the embodiment is formed on a semiconductor substrate made of single crystal silicon or the like by a technology of integrated circuit such as a well-known complementary metal-oxide semiconductor transistor (CMOS).

In the embodiments herein, a metal-oxide semiconductor (MOS) transistor is used as an example of a metal insulator semiconductor field effect transistor (MISFET). In the drawings, a P-channel type MOS transistor (PMOS transistor) is indicated by adding an arrow symbol to its gate to be distinguished from an N-channel type MOS transistor (NMOS transistor). The drawings illustrate no particular connection of a substrate potential of the MOS transistor. However, there is no particular limitation on its connection method as long as the MOS transistor can operate normally.

First Embodiment

A first embodiment is directed to a configuration and a method for performing writing in a predetermined area of a memory array to optimize writing conditions when power is turned ON for a phase-change memory.

Overall System Configuration

FIG. 1 illustrates an entire system of a semiconductor device according to the first embodiment of this invention. The system of this embodiment includes a central processing unit CPU, a phase-change memory PCM, and a memory controller MEM-CONT for receiving an instruction from the central processing unit CPU to control the phase-change memory PCM. The central processing unit CPU and the memory controller MEM-CONT are formed on the same semiconductor chip SOC. The memory controller MEM-CONT includes a management table TABLE and a control register CONT-REG. The management table TABLE includes a condition table CDTABLE. The central processing unit CPU and the phase-change memory PCM are coupled to each other via an address bus PADD and a data bus PDATA. The central processing unit CPU accesses the control register CONT-REG to give an operation instruction to the memory controller. A controller CONT outputs a control signal or an address signal to the phase-change memory PCM based on information written in the control register CONT-REG. The management table TABLE stores information for a bad sector or information for replacing address. The condition table CDTABLE stores which of addresses of the phase-change memory PCM is a trial writing address, which is described below. The memory controller MEM-CONT and the phase-change memory PCM are coupled to each other via, in addition to a command bus MCONT for transmitting the control and an address bus MADD for transmitting an address, a data bus MData for transmitting data and a busy signal bus MRBB for transmitting a ready/busy signal RBB indicating whether the phase-change memory PCM is in the middle of operation. The control signal, the address, and the data can be transmitted by using the same signal line. Reducing the numbers of signal lines enables reduction in mounting costs.

Overall Configuration of Phase-Change Memory

Figure 2:
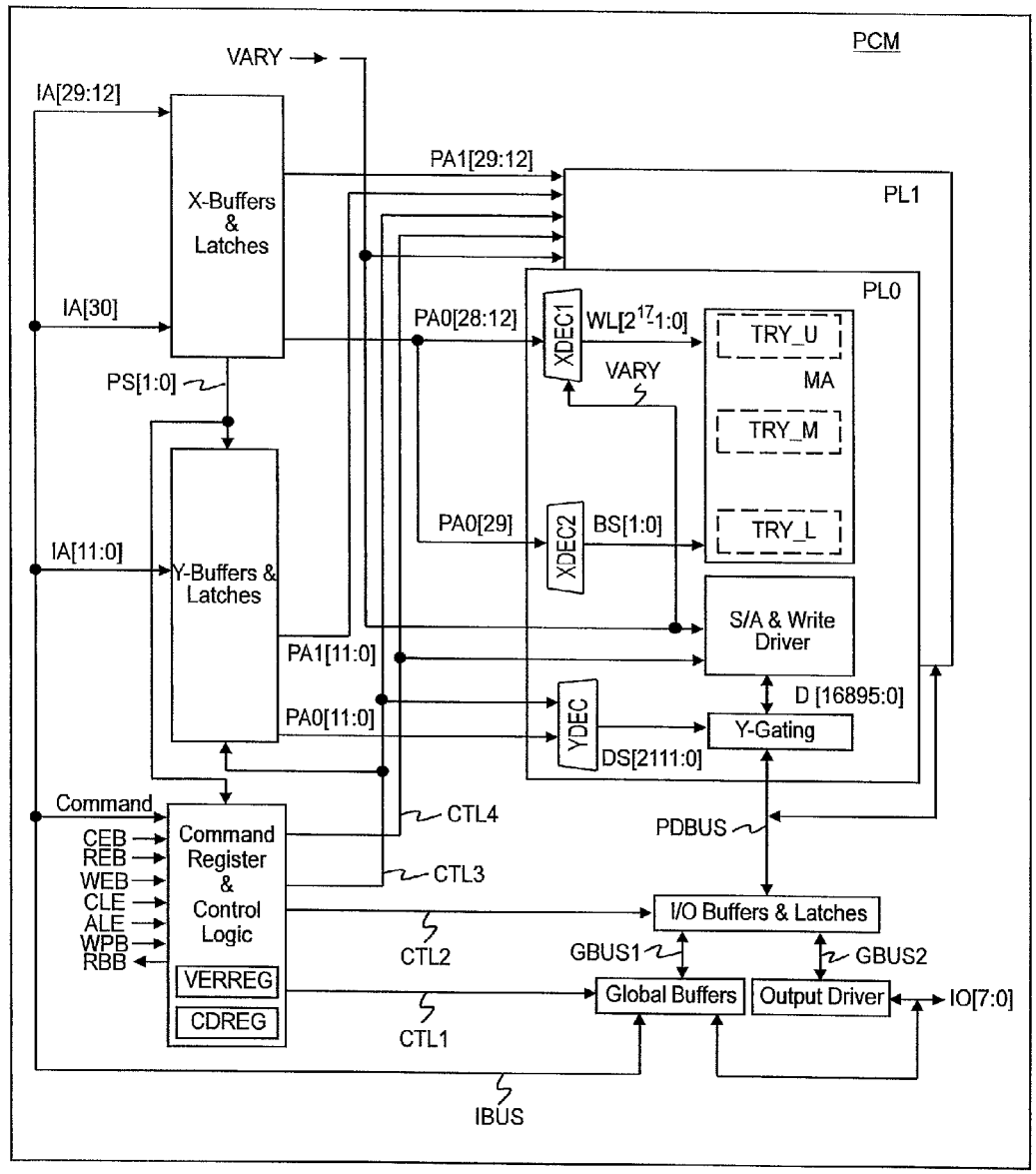
FIG. 2 illustrates an example of a configuration of a phase-change memory illustrated in FIG. 1.

FIG. 2 is a circuit block diagram illustrating a main portion configuration example of the phase-change memory PCM. FIG. 2 illustrates an example of a configuration in the case of 8 gigabits including 4-gigabit memory planes PL0 and PL1. Each memory plane includes a memory array MA, a sense amplifier and write driver (S/A & Write Driver), a column gate (Y-Gating), a column decoder YDEC, a first row decoder XDEC1, and a second row decoder XDEC2. The memory array MA includes memory cells having storage layers made of chalcogenide materials and cell select diodes and arranged in a two-dimensional matrix. The sense amplifier and write driver is a circuit block for reading stored information from the memory array and writing stored information in the memory array. The column gate (Y-Gating) is a circuit block coupled to the sense amplifier and write driver via 16,896 ($=2^{14}+2^9$) data line pairs D[16895:0], and to an input/output data buffers and latches (I/O Buffers & Latches) via a plane data bus PDBUS to receive/transmit stored information.

An operation of each decoder is described below focusing on the memory plane PL0. The column decoder YDEC is a circuit block for selecting a gate to be activated in the column gate for coupling the sense amplifier and write driver to the input/output data buffers and latches. The first and second row decoders XDEC1 and XDEC2 are circuit blocks for selecting memory cells to be activated. The first row decoder is a circuit block for selecting one of 131,072 ($=2^{17}$) word lines WL[131071:0] to activate it according to an internal address PA0[28:12] distributed for the memory plane PL0. The second row decoder is a circuit block for selecting one of two bit-line select lines BS[1:0] to activate it according to an internal address PA0[29] distributed for the memory plane PL0.

An array voltage VARY is supplied to the first row decoder XDEC1 and the write driver from the outside of the phase-change memory PCM. The array voltage is changed in an additional writing during write-verify operation as occasion demands as described below.

In this embodiment, the memory array MA includes a re-write area TRY. In the re-write area TRY, writing is performed under a plurality of conditions by changing a value of a current flowing through the memory cell and time (pulse width) when power is turned ON. Hereinafter, writing under a plurality of conditions are referred to as "trial writing", and conditions for trial writing are referred to as "trial writing conditions". In this embodiment, the memory array MA includes re-write areas TRY_U, TRY_M, and TRY_L respectively in its upper, middle and lower parts. For example, the upper re-write area TRY_U is a memory cell on a word line WL0. The middle re-write area TRY_M is a memory cell on a word line WL65536. The lower re-write area TRY_L is a memory cell on a word line WL131071. Trial writing operations using these re-write areas are described below. The re-write areas do not have to be disposed in three areas as in this embodiment. They may be disposed together in one place.

Next, a block of peripheral circuits is described. Stored information, a command signal, and an address signal processed in the phase-change memory of this invention are transmitted/received to/from an I/O line IO[7:0] via a global buffer or an output driver. The I/O line group IO[7:0] is a signal line group where the command bus MCONT, the address bus MADD, and the data bus MData, which are illustrated in FIG. 1, are common. The global buffer is controlled based on a control signal group CTL1. The stored information is further transferred between the global buffer or the output driver and the input/output data buffers and latches (I/O Buffers & Latches) via a corresponding global bus GBUS1 or global bus GBUS2. The input/output data buffers and latches (I/O Buffers % Latches) are controlled based on a control signal group CTL2. The command signal is transferred from the global buffer to a command register and a control logic (Command Register & Control Logic) via a internal bus IBUS. The address signal IA[30:0] is transferred to the address buffer group and a latch group via the internal bus IBUS. Specifically, the address signal IA[11:0] is transferred to a column buffers and latches (Y-Buffers & Latches). The address signal IA[30:12] is transferred to a row buffers and latches (X-Buffers & Latches).

The command register and the control logic (Command Register & Control Logic) distribute control signal groups CTL1 to CTL4 to the blocks of the phase-change memory according to memory plane select signals PS[1:0] output from the row buffers and latches (X-Buffers & Latches) and a plurality of control signals. The plurality of control signals specifically include a command latch enable signal CLE, an address latch enable signal ALE, a chip latch enable signal CEB, a read enable signal REB, a write enable signal WEB, a write protect signal WPB, and a ready/busy signal RBB. The command latch enable signal CLE is for activating the command register which temporarily stores a command signal. The address latch enable signal ALE is for activating the address buffer group and the latch group which temporarily store an address signal. The chip latch enable signal CEB is for selecting a phase-change memory chip. The read enable signal REB is for activating the output driver while generating a column address in the chip to output stored information. The write enable signal WEB is for receiving the stored information, the command signal, and the address signal. The write protect signal WPB is for preventing an unexpected writing operation at the time of turning power ON. The ready/busy signal RBB is for notifying of whether a status in the chip is a reading/writing operation.

The command register and the control logic (Command Register & Control Logic) include a verify-reading cycle register VERREG and a condition set register CDREG. The verify-reading cycle register indicates, during a trial writing operation, how many times verification has been performed in writing under a certain condition. The condition set register CDREG sets writing conditions (current amount flowing through the memory cell, and period).

The row address buffer group and the latch group (X-Buffers Latches) constitute a circuit block for transferring address signals IA[29:12] to the memory planes PL0 and PL1 according to a memory plane select signal PS[1:0]. A transfer destination memory plane is selected based on memory plane control signals PS0 and PS1 generated according to an internal address signal PA[29] similar to the internal address signal PA0[11:0].

Configuration of Memory Array

Figure 3:
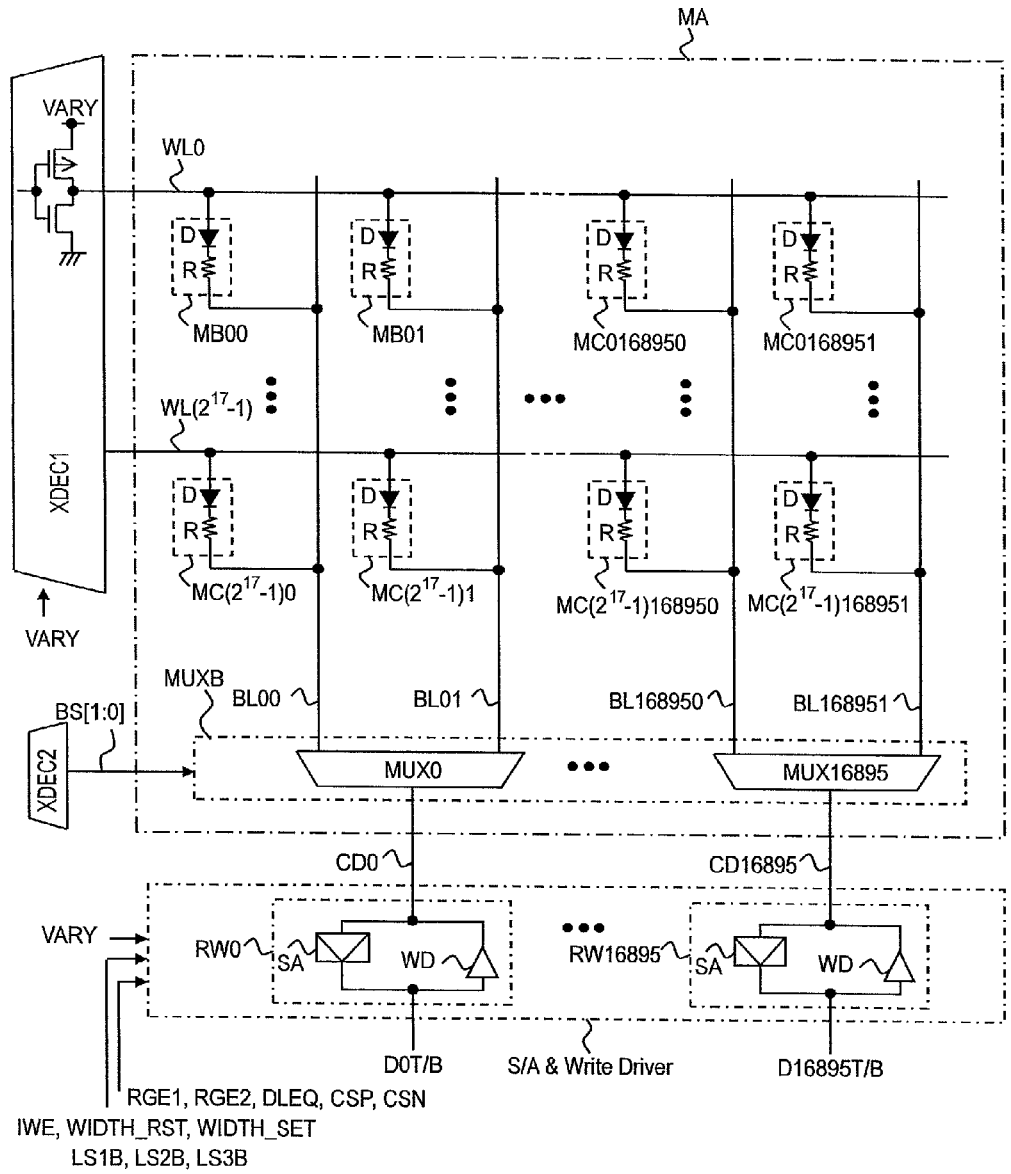
FIG. 3 illustrates an example of a configuration of a memory array in the phase-change memory illustrated in FIG. 2.

FIG. 3 illustrates a detailed configuration example of the memory array MA illustrated in FIG. 1. A memory cell unit accessed by one reading or writing operation is referred to as a page hereinafter. The memory array MA of FIG. 3 includes 262,144 (=$2^{18}$) pages. Each page includes a main area of 2 kilobytes and a spare area of 64 bytes. A total of these areas amounts to 2,112 kilobytes. The memory array MA having such characteristics is described below in detail.

The memory array MA includes memory cells MC0 to MC(=$2^{17}$-1)168951 disposed at intersection points between 33,792 (=($2^{14}$+$2^9$)×2) bit-lines and 131,072 (=$2^{17}$) word lines, and a block of multiplexer MUXB. Each memory cell is configured such that a phase-change resistive device R having a function of a storage layer made of a chalcogenide material and a memory cell select diode D are coupled in series between corresponding bit and word lines. FIG. 3 illustrates no re-write area. However, a memory cell configuration is the same.

The block of multiplexer MUXB includes multiplexers MUX0 to MUX16895 corresponding to 16,896 (=$2^{14}$+$2^9$) sense amplifiers (described below in detail). Each of the multiplexers MUX0 to MUX16895 is, for example, as in the case of the multiplexer MUX0, a circuit for selecting one of two bit-lines BL00 and BL01 according to a bit-line select signal BS[1:0] to couple it to a common data line CD0.

FIG. 3 illustrates a sense amplifier and write driver (S/A & Write Driver). The sense amplifier and write driver (S/A & Write Driver) includes read and write circuits RW0 to RW16895 corresponding to 16,896 (=$2^{14}$+$2^9$) multiplexers MUX0 to MUX16895. Each of the read and write circuits RW0 to RW16895 is, for example, as in the case of the read and write circuit RW0, disposed between the common data line CD0 and a data line pair D0T/B. The read and write circuit RW0 includes a sense amplifier SA and a write driver WD.

Configurations of Sense Amplifier and Write Driver

Figure 4:
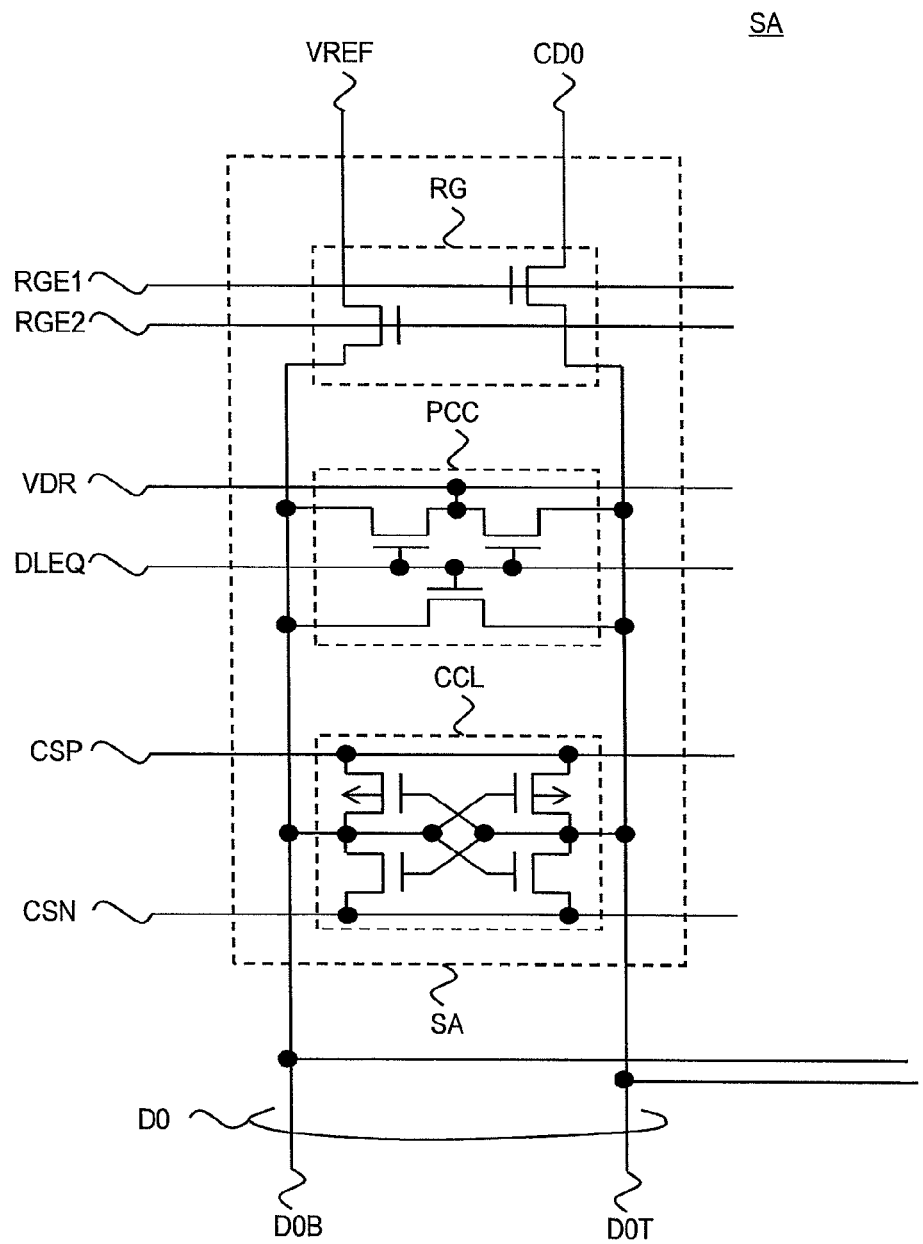
FIG. 4 illustrates an example of a configuration of a sense amplifier in the phase-change memory illustrated in FIG. 2.

Specific configuration examples of the sense amplifier and write driver (S/A & Write Driver) are described below. FIG. 4 illustrates an example of the sense amplifier SA in the read and write circuit RW0. The sense amplifier SA has well-known circuitry which includes a pre-charge circuit PCC, a cross-couple type latch amplifier CCL, and a transfer gate RG.

The pre-charge circuit PCC includes three NMOS transistors. The pre-charge circuit PCC is activated when a data line equalize signal DLEQ is driven to a boost voltage VPP higher than a power supply voltage VDD in a standby state, thereby driving a pair of data lines D0T and D0B to a reference voltage VDR (e.g., VDD/2).

The cross-couple type latch amplifier CCL includes two PMOS transistors and two NMOS transistors. In the standby state, common source lines CSP and CSN are driven to a pre-charge voltage (reference voltage VDR in this case) equal to that of the pair of data lines D0T and D0B. In a reading operation, when a signal corresponding to information stored in the selected memory cell is generated at the data line D0T, the common source line CSP is activated by being driven to the power supply voltage VDD, and the common source line CSN is activated by being driven to a ground voltage VSS, thereby amplifying very small signals generated in the pair of data lines D0T and D0B.

The transfer gate RG includes two NMOS transistors inserted between a cross-couple type sense latch and the memory cell array. In a reading operation, transfer gate start signals RGE1 and RGE2 are driven to the boost voltage VPP to be activated, and the common data line CD0 and a reference voltage VREF (e.g., VDD/2) are coupled to the cross-couple type latch amplifier to transfer a signal read from the selected memory cell to the cross-couple type sense latch. The data line equalize signal DLEQ, the common source lines CSP and CSN, and the transfer gate start signals RGE1 and RGE2 are components of the control signal group CTL4.

Figures 5, 6:
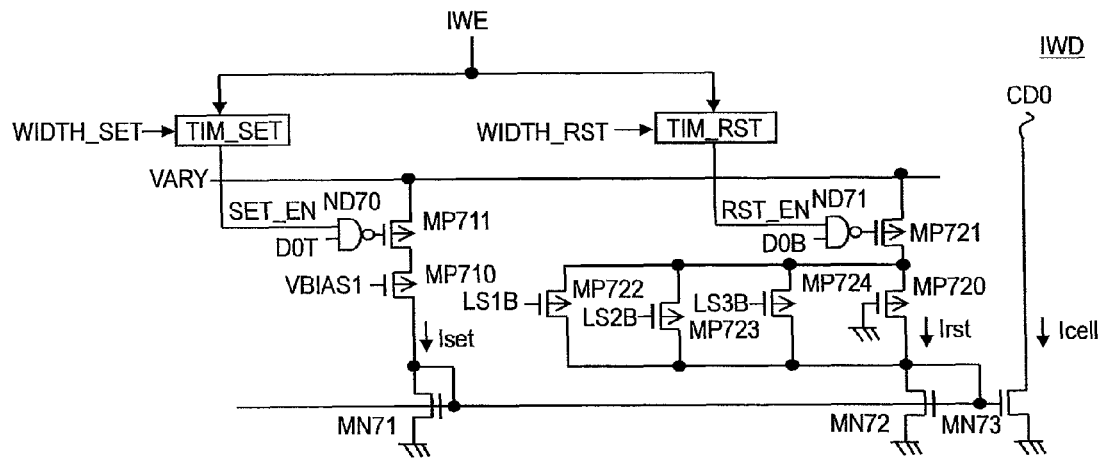
FIG. 5 illustrates an example of a configuration of a write driver in the phase-change memory illustrated in FIG. 2.
FIG. 6 illustrates an example of a reset operation in the write driver illustrated in FIG. 5.

FIG. 5 illustrates a configuration of the write driver WD. This write driver is characterized by its capability of generating a plurality of conditions necessary for trial writing. In a reset operation, the write driver WD can control a value of a current Irst flowing through the memory cell according to current select signals LS1B to LS3B supplied from the command register and the control logic (Command Register & Control Logic), and a flowing period according to current bias time WIDTH_RST set by the command register and the control logic (Command Register & Control Logic). In a setting operation, the write driver WD controls, without changing a value of a current, only a flowing period according to current bias time WIDTH_SET set by the command register and the control logic (Command Register & Control Logic). This is because it is more advantageous to change the period of supplying heat for a crystallizing operation in the setting operation. However, there is an optimal level for a crystallization temperature, and hence a value of a flowing current may be controlled as in the case of the reset operation while a circuit size increases a little.

Basic components of the write driver are two current mirror circuits which include NMOS transistors MN71, MN72, and MN73. First, configurations of the current mirror circuits are described.

The first current mirror circuit includes a combination of the transistors MN71 and MN73. PMOS transistors MP710 and MP711 are inserted in series between the transistor MN71 and the array voltage VARY. A bias voltage VBIAS1 is input to a gate of the transistor MP710. An output signal of a two-input NAND circuit ND70 to which a set enable signal SET_EN and a data line D0T have been input is input to a gate of the transistor MP711. With this configuration, when the memory cell is set in a low-resistance state, in other words, stored information "1" is written, a memory cell current Icell applied via the common data line CD0 is controlled to a value Iset necessary for a setting operation. The set enable signal SET_EN is controlled by a set timer TIM_SET. The set timer TIM_SET counts, after activation of an internal write enable signal IWE, current bias time WIDTH_SET set by the command register and the control logic (Command Register & Control Logic), and activates the set enable signal SET_EN during this period. Thus, a current for setting flows to the memory cell for a period equivalent to the current bias time WIDTH_SET set by the command register and the control logic (Command Register & Control Logic).

The second current mirror circuit includes a combination of the transistors MN72 and MN73. PMOS transistors MP720, MP722, MP723, MP724, and MP721 are inserted in series or in parallel between the transistor MN72 and the array voltage VARY. Gate widths of the transistors coupled in parallel are set larger in order of the transistors MP720, MP722, MP723, and MP724. The ground voltage VSS is input to a gate of the transistor MP720. Current select signals LS1B to LS3B are respectively input to gates of the transistors MP722, MP723, and MP724. An output signal of a two-input NAND circuit ND71 to which a reset start signal RST_EN and a data line D0B have been input is input to a gate of the transistor MP721. With this configuration, when the memory cell is set in a high-resistance state, in other words, stored information "0", is written, a memory cell current Icell applied via the common data line CD0 is controlled. Specifically, in the case of a reset condition A as illustrated in FIG. 6, the transistor MP720 is made conductive to set a reset current Irst to Irst0. In the case of performing a writing operation in the memory cell under a reset condition B, the transistors MP720 and MP722 are made conductive to set a reset current Irst to (m+1)×Irst0. In the case of performing a writing operation under a reset condition C, the transistors MP720 and MP723 are made conductive to set a reset current Irst to (k+1)×Irst0. In the case of performing a writing operation under a reset condition D, the transistors MP720 and MP724 are made conductive to set a reset current Irst to (j+1)×Irst0. The coefficients m, k, and j are set in a relationship of m<k<j. Thus, currents with various values can flow to the memory cell based on reset conditions set by the command register and the control logic (Command Register & Control Logic). The reset current Irst is set to a value larger than the set current Iset.

As in the case of the first current mirror circuit, a period of supplying a current to the memory cell can be controlled by using a reset timer TIM_RST.

As described above, the second current mirror circuit is characterized in that the transistors MP720, MP722, MP723, and MP724 different from one another in gate width are coupled in parallel, and a transistor to be made conductive is selected according to a current select signal. With this configuration, an optimal reset current can be supplied. The transistor MP720 can be removed because it is in a conductive state.

Trial Writing Operation

Figure 7:
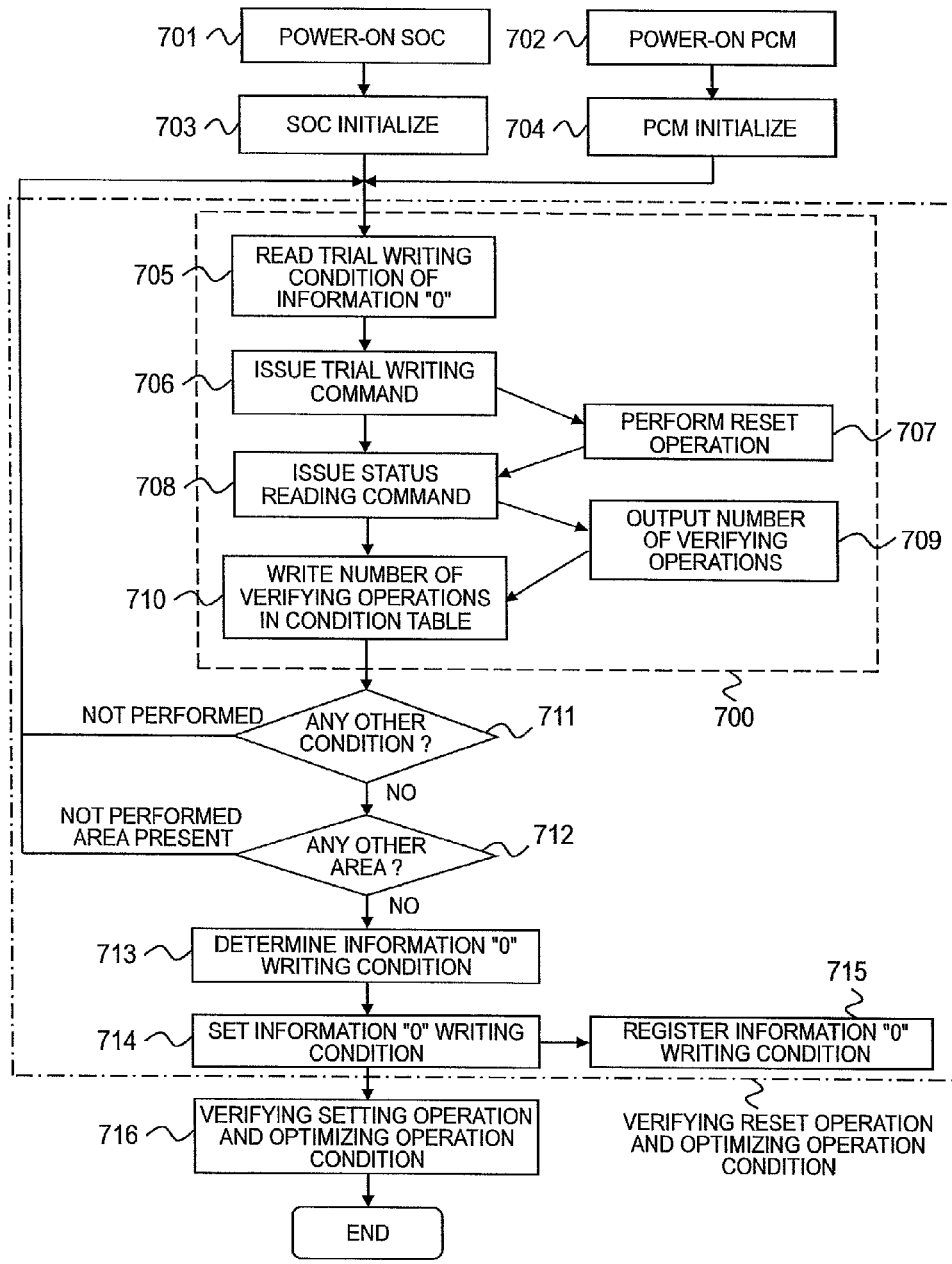
FIG. 7 is a flowchart illustrating an example of a sequence of a trial writing operation in the phase-change memory system illustrated in FIG. 1.

Referring to FIG. 7, a trial writing operation is described below. FIG. 7 is a flowchart illustrating the trial writing operation. After power is turned ON (701, 702), the memory controller MEM_CONT and the phase-change memory are subjected to initial setting (703, 704). In this case, stored information "1" is written in the re-write area of phase-change memory, in other words, a setting operation is performed, to set the memory element of the re-write area in a set state. Then, the memory controller reads trial writing conditions of stored information "0" (705), in other words, a reset execution condition, from the condition table CDTABLE in the management table TABLE.

Figure 8:
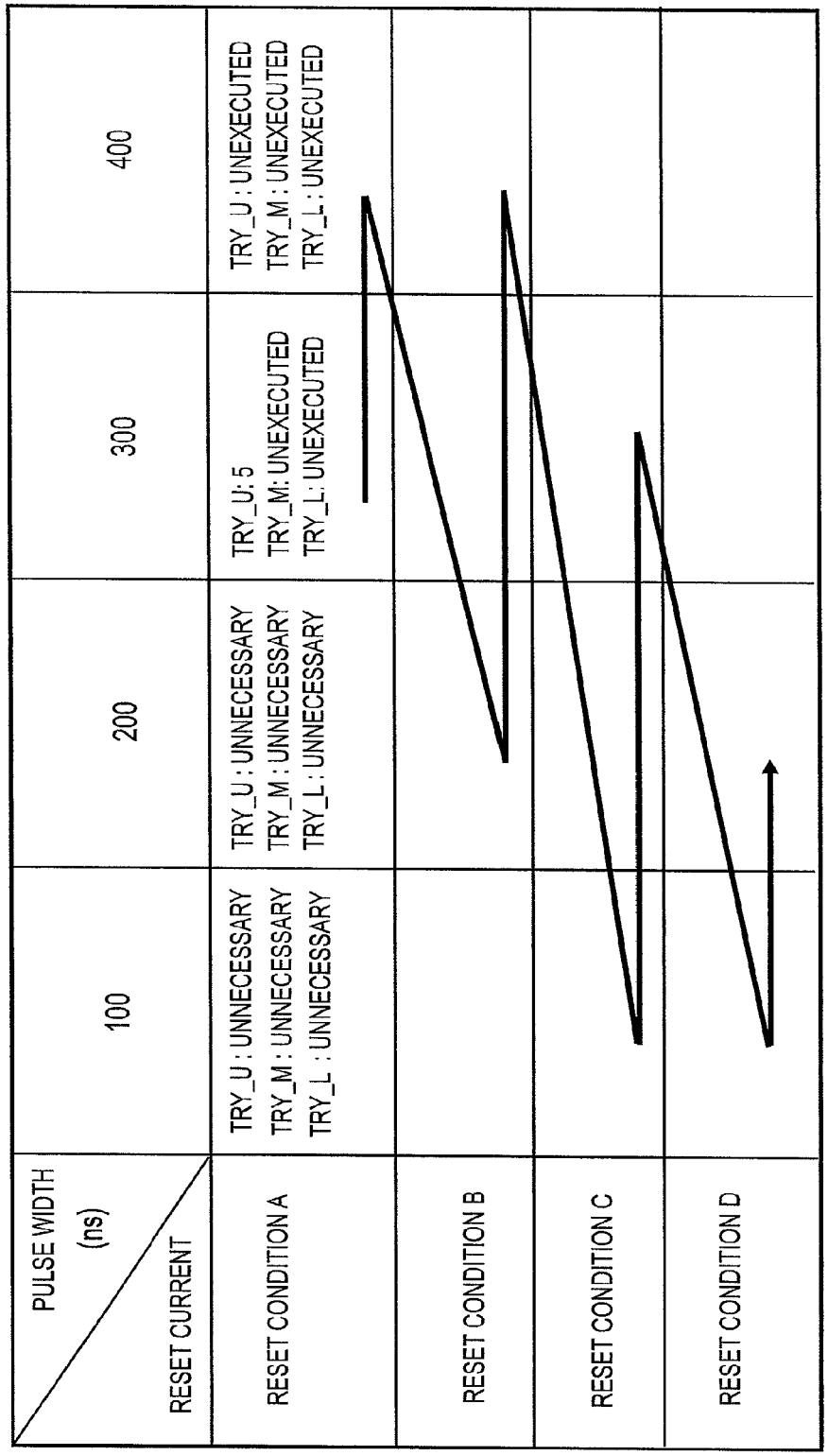
FIG. 8 illustrates an example of a condition table illustrated in FIG. 1.

FIG. 8 illustrates the condition table CDTABLE for managing the trial writing conditions in detail. An axis of ordinate indicates a reset current, and an axis of abscissa indicates a period. A zigzag arrow indicates in what order the trial writing conditions are changed. The controller CONT operates according to the condition table CDTABLE. In this example, the operation is repeated starting from a pulse width 300 ns/reset condition A in order from a pulse width 400 ns/reset condition A to a pulse width 200 ns/reset condition B. As illustrated, all the conditions do not have to be executed. For example, if inhibition of resetting is clearly known in the pulse with 100 ns and under the reset condition A (smallest current), this portion does not have to be tried. The condition table CDTABLE manages in which of re-write areas a trial writing operation has been finished, when there is a plurality of re-write areas. In this case, because of the first-time execution, the controller CONT selects a pulse width 300 ns/reset condition A to read the condition (for subsequent description, TRY_U is "unexecuted" while it is not "unexecuted" here).

Referring back to FIG. 7, a sequel of the trial writing operation is described. The controller CONT issues a trial writing command in the upper re-write area TRY_U to the phase-change memory PCM under the read condition (300 ns/condition A) (706). The issuing method is described below. The phase-change memory PCM that has received the trial writing command performs a reset operation in the upper re-write area TRY_U under a condition contained in the trial writing command (707). In this reset operation, the phase-change memory PCM performs a verify-reading to judge whether resistance has increased to a desired value. The verify-reading is controlled by the command register and the control logic (Command Register & Control Logic). The command register and the control logic (Command register & Control Logic) stores how many times verification has been executed under the condition in the verify-reading cycle register VERREG included in the command register and the control logic (Command Register & Control Logic). After completion of the reset operation, the phase-change memory PCM notifies the completion of the reset operation to the memory controller MEM_CONT of the completion. Rewriting of the stored information "0" may always be carried out under the same operation condition, or by gradually increasing the array voltage VARY illustrated in FIG. 5.

The memory controller that has received the notification from the phase-change memory PCM issues a status reading command (708), and reads how many times verification has been carried out from the verify-reading cycle register VERREG (709, 710) to write it in the condition table CDTABLE illustrated in FIG. 8 (710). In this example, the cycle of verify-readings is five (TRY_U:5). Thus, the trial writing operation is finished for one writing condition (700).

Then, whether a next writing condition is unexecuted is checked (711). In this case, a next 400 ns/condition A is unexecuted. Thus, to perform trial writing again, a trial writing command is issued to the phase-change memory PCM (706). The similar operation 700 is performed for a necessary condition.

Preferably, the cycle of verify-readings under a predetermined condition is stored in the condition table CDTABLE to keep record as in this embodiment. Keeping record and learning enable determination of conditions under which resetting cannot be performed clearly, thereby reducing conditions for the trial writing operation.

After the end of all the conditions to be tried for the upper re-write area TRY_U, whether any other areas are unexecuted is checked (712). In this case, the middle re-write area TRY_M is unexecuted, and hence the memory controller MEM_CONT starts a similar operation in the middle re-write area TRY_M. Then, the memory controller MEM_CONT performs a similar trial writing operation in the lower re-write area TRY_L.

After the end of the trial writing operations in all the re-write areas TRY, the memory controller MEM_CONT checks the cycle of verify-readings under each condition in the management table to determine a most appropriate reset condition and period. Then, a condition setting command for registering the determined reset condition and period in the condition set register CDREG included in the command register and the control logic (Command Register & Control Logic) of the phase-change memory PCM is issued to set a writing condition (714, 715). Thus, reset operation verification and operation condition optimization are completed.

Then, for a setting operation, as in the case of the reset operation, set operation verification and operation condition optimization are performed for the upper, middle and lower re-write areas TRY to set a condition (716). FIG. 9 illustrates a table for managing set conditions in the condition table CDTABLE. In the case of performing a setting operation, stored information "1" may be output to the phase-change memory via the I/O line IO[7:0]. In this embodiment, the setting operation is performed only within the period, and hence a period of the trial writing operation can be shortened. When the setting operation is completed, the trial writing operation is finished. Rewriting of the stored information "1" may always be performed under the same operation condition, or by gradually increasing the array voltage VARY illustrated in FIG. 5.

Figure 10:
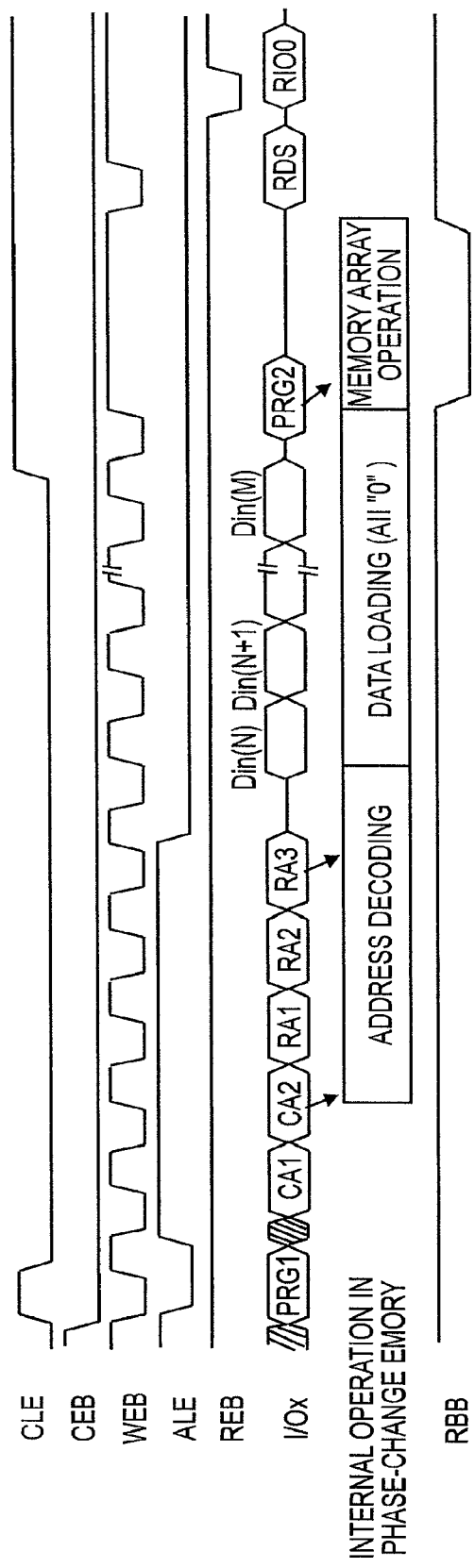
FIG. 10 illustrates an example of a signal waveform of a trial writing operation of a reset operation in an upper re-write area in the phase-change memory illustrated in FIG. 1.

FIG. 10 illustrates an example of a waveform of each signal of a trial writing operation in a reset operation in the upper re-write area. First, the memory controller drives a command latch enable signal CLE of a low level to a high level, and a chip latch enable signal CEB and an address latch enable signal ALE of high levels to low levels. Then, when a first trial write command signal PRG1 is input via the I/O line I/Ox (x=0 to 7), the first trial write command signal PRG1 is captured into the phase-change memory PCM by a rising edge of a write enable signal WEB. The memory controller drives the command latch enable signal CLE of the high level to a low level and the address latch enable signal ALE of the low level to a high level to sequentially input an address indicating the upper re-write area TRY_U twice as column addresses (CA1 and CA2) and three times as row addresses (RA1, RA2, and RA3). These addresses are captured into the phase-change memory chip by the rising edge of the write enable signal WEB to sequentially decode the addresses in the chip. The memory controller drives the address latch enable signal ALE of the high level to a low level, and inputs stored information Din(N) to Din(M) of "0" corresponding to the reset operation via the I/O line I/Ox (x=0 to 7). Then, the memory controller drives the command latch enable signal CLE of the low level to a high level to input a second trial write command signal PRG2 to the I/O line I/Ox (x=0 to 7). The second trial write command signal PRG2 is captured into the phase-change memory chip by the rising edge of the write enable signal WEB to perform a trial write operation. In the trial write operation, a ready/busy signal RBB of a high level is driven to a low level. After the end of the rewriting operation, the ready/busy signal RBB of the low level is driven to a high level, and then a status reading command signal RDS is input. The status reading command signal RDS is captured into the chip by the rising edge of the write enable signal WEB. In synchronization with the read enable signal REB, the cycle of verify-readings RIO0 is output from the I/O line I/Ox (x=0 to 7).

Performing the trial writing enables setting of optimal reset/set conditions according to changes of rewriting conditions by heat history due to conditions during manufacturing or the number of rewriting operations. As a result, the cycle of verify-readings can be reduced, a stable and high-speed operation can be performed. Moreover, trial writing is performed in the three places, i.e., the upper, middle and lower parts of the memory array MA, and respective results are checked. Thus, changes of the rewriting conditions caused by the positions can be taken into consideration even when the memory array becomes large, and most appropriate conditions can be set as a whole.

Needless to say, when any changes due to the position of the memory array do not have to be taken into consideration, three re-write areas are not necessary, but only one area may be disposed.

Second Embodiment

Figure 11:
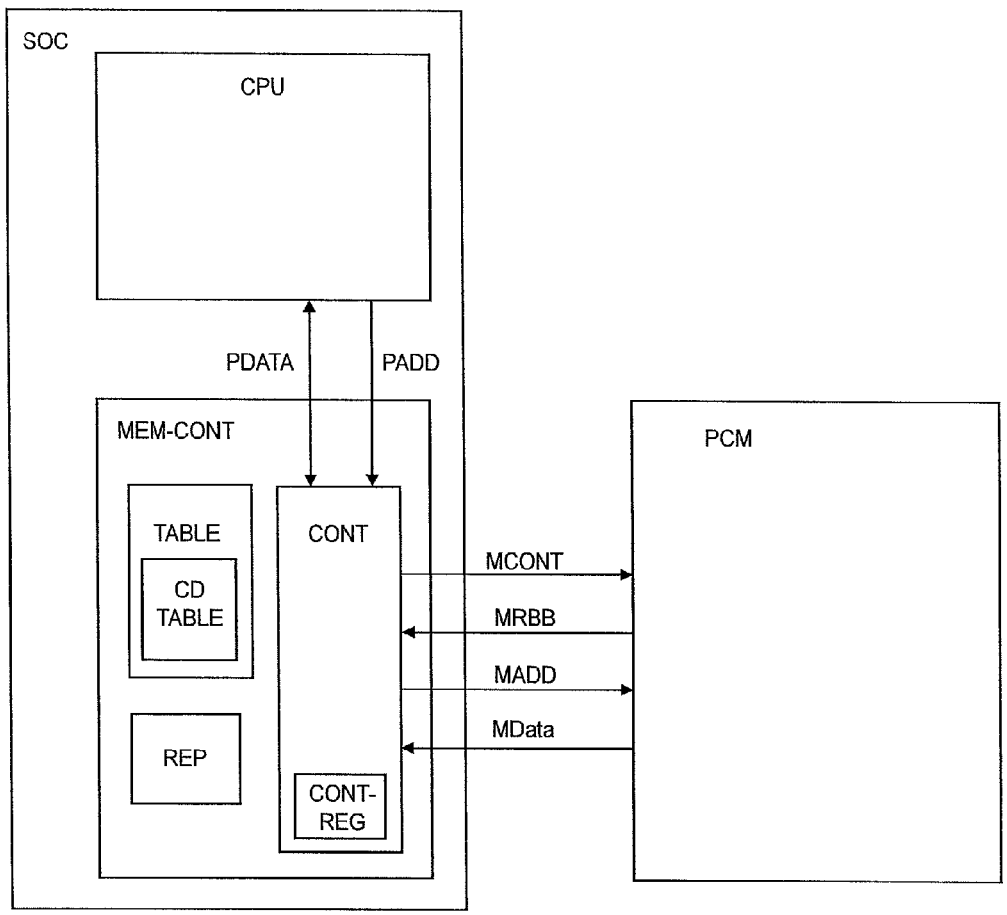
FIG. 11 illustrates an example of a configuration of a phase-change memory system in a semiconductor device according to a second embodiment of this invention.

Next, a second embodiment of this invention is described. A phase-change system of the second embodiment includes an address replace circuit REP in a memory controller MEM_CONT as illustrated in FIG. 11. The address replace circuit REP checks whether writing fails when the writing is performed in a phase-change memory PCM. When the writing fails, the address replace circuit REP manages the address as a defect address, and manages which address the defect address is converted into. The address replace circuit REP registers a defect address identified by testing during manufacturing and its replace address.

In a phase-change element, even in the case of writing inhibition during manufacturing, in other words, a failure memory cell, applying writing currents several times may change element characteristics to enlarge a resistance change, in other words, to enable a normal operation. This embodiment is characterized in that by using such characteristics, writing is performed in the defect address managed by the address replace circuit REP in a period of no access from a central processing unit CPU, whether the writing fails is checked again, and the address is removed from the defect address management to be made usable when the writing succeeds.

Figure 12:
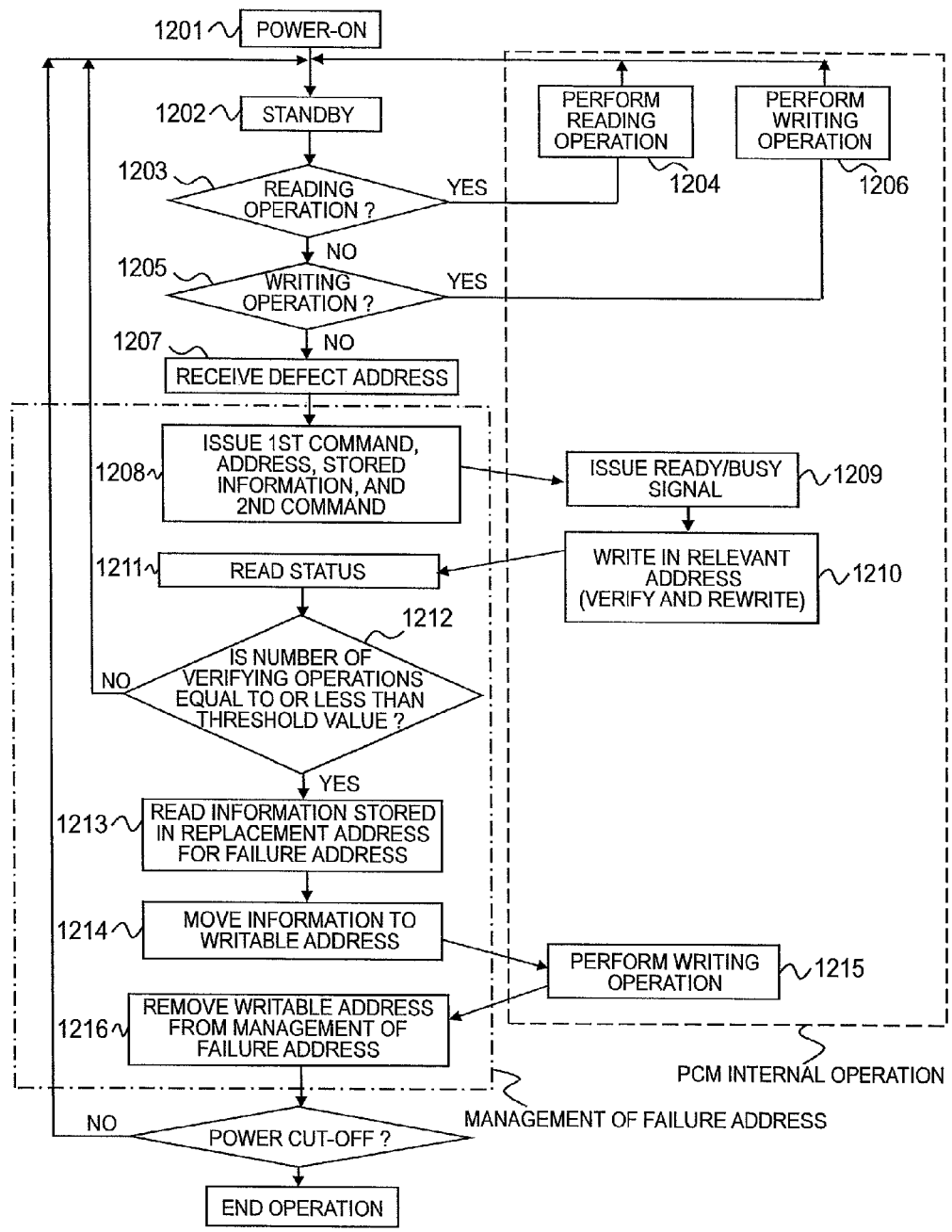
FIG. 12 is a flowchart illustrating an example of a sequence of a trial writing operation in a defect address in the phase-change memory system illustrated in FIG. 11.

Referring to FIG. 12, a specific operation is described. First, the memory controller MEM_CONT reads a defect address managed by the address replace circuit during a period of no access from the central processing unit CPU (1201 to 1207) to output a first writing command, an address, and stored information (1208). The memory controller MEM_CONT issues a second writing command (1208). The phase-change memory PCM receives an output from the memory controller MEM_CONT, drops a ready/busy signal (1209), and performs a writing operation in the defect address (1210). The writing operation includes a verify-reading, and the cycle of verify-readings is stored in a verify-reading cycle register VERREG. Then, the ready/busy signal is raised. After the rising of the ready/busy signal, a controller CONT issues a status reading command to read the cycle of verify-readings from the verify-reading cycle register VERREG (1211). If the cycle of verify-readings is larger than a predetermined number (1212), judging that the writing has failed, the controller CONT finishes the operation. On the other hand, if the read cycle of verify-readings is smaller than the predetermined number (1212), the controller CONT judges that the writing has succeeded. In other words, defect memory cells have restored to writable condition. In this case, if the address is removed simply from defect address management of the address replace circuit REP, when the address is designated to access next time, no address replacement processing is carried out, but different information is read. Thus, when the writing has succeeded, the controller CONT issues a reading command to the phase-change memory PCM to read information stored in a replace address by the address replace circuit REP (1213). Then, the controller CONT issues first and second writing commands to a restored address and directly writes the information without replacing address (1214, 1215). After an end of this processing, the address is removed from the defect address management of the address replace circuit REP (1216).

This operation enables automatic improvement of characteristics of the failure memory cell on the user side after the shipment, supplementing a memory capacity. Such a function is especially useful for a storage of a large capacity. For the storage of a large capacity, the chip may be shipped allowing failure to some extent. The memory of this form is recognized as Mostly Good Memory. Conventionally, use has been inhibited from a memory cell which has reached the upper limit number of rewriting operations, and thus a memory capacity has only been reduced. However, use of the function of this embodiment enables compensation for memory cells, suppressing reduction in memory capacity.

In this embodiment, whether the writing operation has failed is judged based on the cycle of verify-readings stored in the verify-reading cycle register VERREG. However, a flag indicating whether the writing has succeeded may be separately disposed to make judgment.

Third Embodiment

Figure 13:
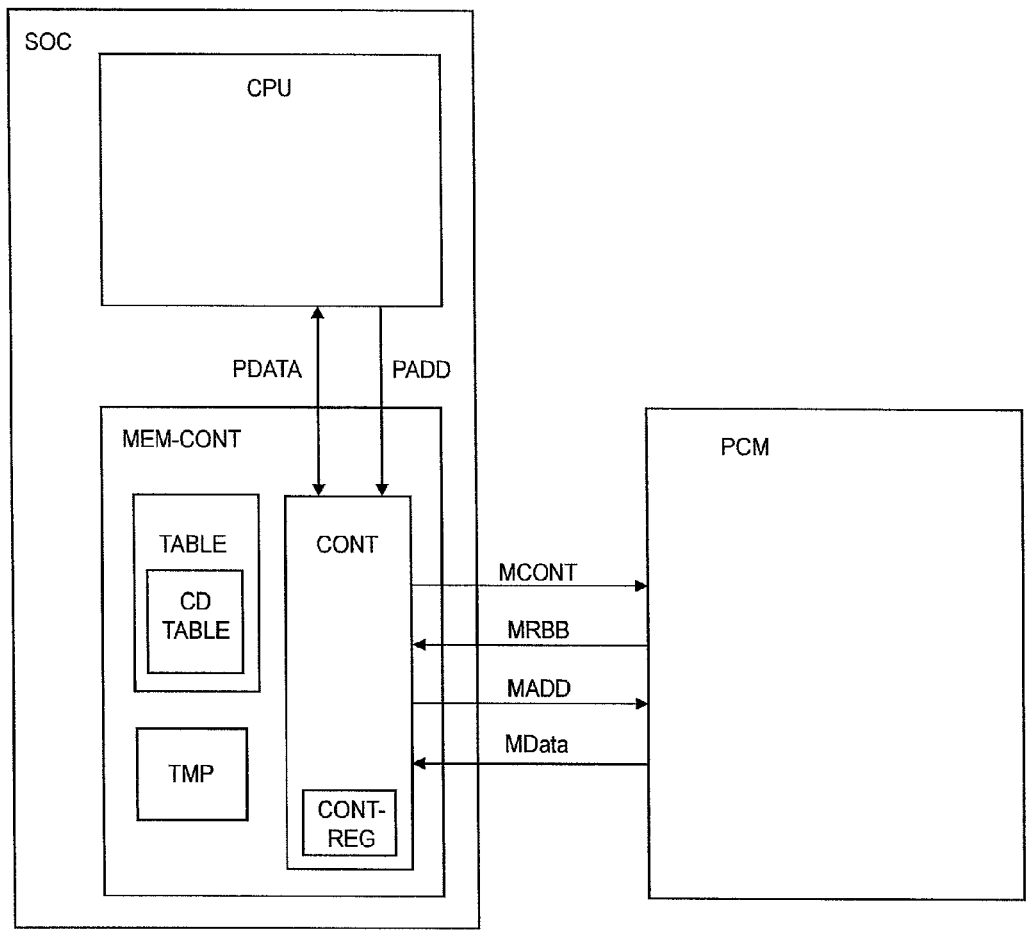
FIG. 13 illustrates an example of a configuration of a phase-change memory system in a semiconductor device according to a third embodiment of this invention.

A third embodiment of this invention is described. A configuration of a memory system of the third embodiment illustrated in FIG. 13 is different from that of the first embodiment illustrated in FIG. 1 in that a memory controller MEM_CONT includes a thermometer TMP. A phase-change memory PCM is easily affected by an ambient temperature because a state of a phase-change element is changed by a supplied amount of heat. In other words, a change in ambient temperature changes optimal writing conditions. In this embodiment, the ambient temperature is observed by the thermometer TMP, and when a change in ambient temperature is detected, a controller CONT is notified of the change by the thermometer TMP. The controller CONT that has received the notification performs a trial write operation similar to that of the first embodiment to set optimal conditions again.

In this way, even during an operation of the system, the optimal writing conditions can be maintained.

In this embodiment, the change in ambient temperature is managed by the thermometer TMP to be used as a trigger of a trial write operation. However, periodically performing a trial write operation by a timer enables dealing with the change in ambient temperature.

A temperature measured by the thermometer TMP and a result of trial writing executed at this temperature are associated with each other to be stored in a condition table CDTABLE. In this way, record of optimal conditions at each temperature is left and by using this record, optimal conditions can be set at each temperature.

Fourth Embodiment

Figure 14:
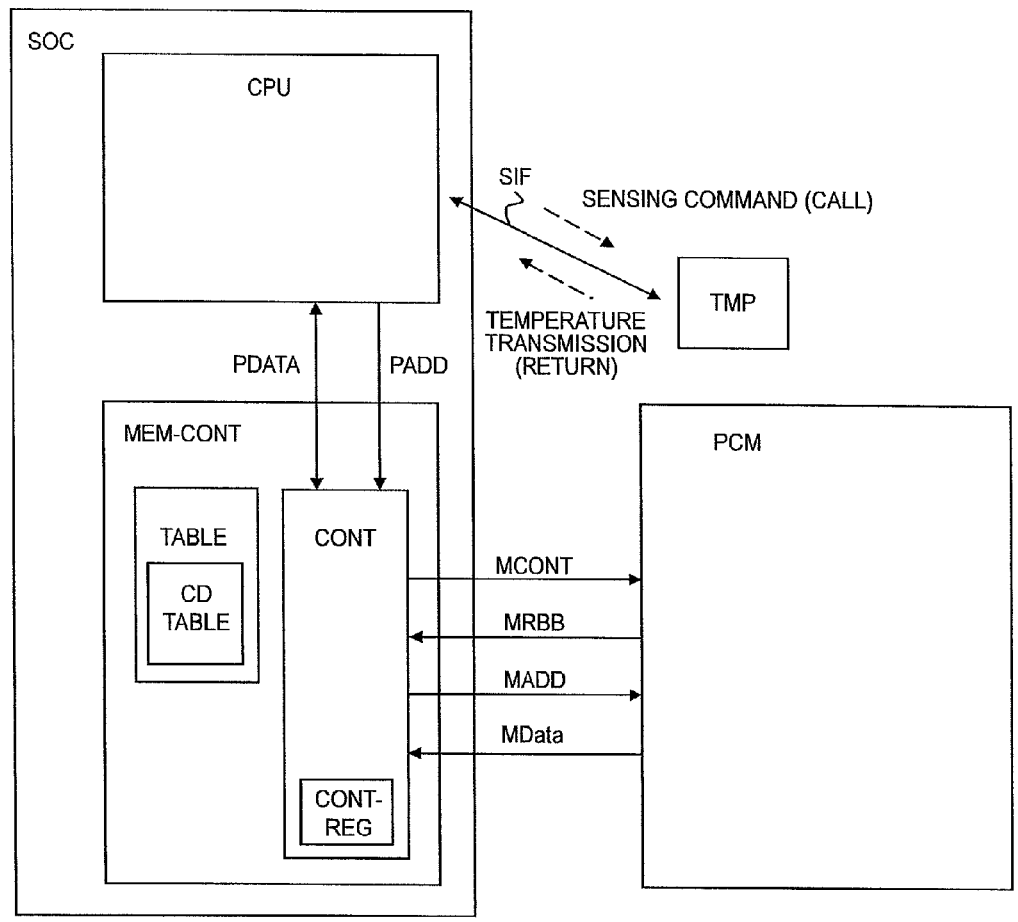
FIG. 14 illustrates an example of a configuration of a phase-change memory system in a semiconductor device according to a fourth embodiment of this invention.

A fourth embodiment is described. The third embodiment is suited to the system where the memory controller MEM_CONT and the phase-change memory PCM are present at relatively close positions, but not suitable when the memory controller MEM_CONT and the phase-change memory PCM are positioned at places away from each other. It is because even if a temperature in the memory controller MEM_CONT is detected, when the phase-change memory PCM is in a far position, its ambient temperature is different. In such a case, a configuration may be employed where a thermometer is disposed in the phase-change memory PCM affected by the ambient temperature, and the phase-change memory PCM notifies the memory controller MEM_CONT of a temperature change. In this case, however, an interface with the memory controller MEM_CONT may be changed or a thermometer may be specially disposed, losing versatility. Thus, as illustrated in FIG. 14, this embodiment employs a configuration where a temperature sensor TMP formed on another chip is disposed at a position near the phase-change memory PCM. The system on chip (SOC) and the temperature sensor TMP are interconnected via a sensor interface SIF. This sensor interface SIF may be wired or wireless according to a distance between the SOC and the phase-change memory PCM. Thus, the system can be realized without changing the phase-change memory PCM at all.

Figure 15:
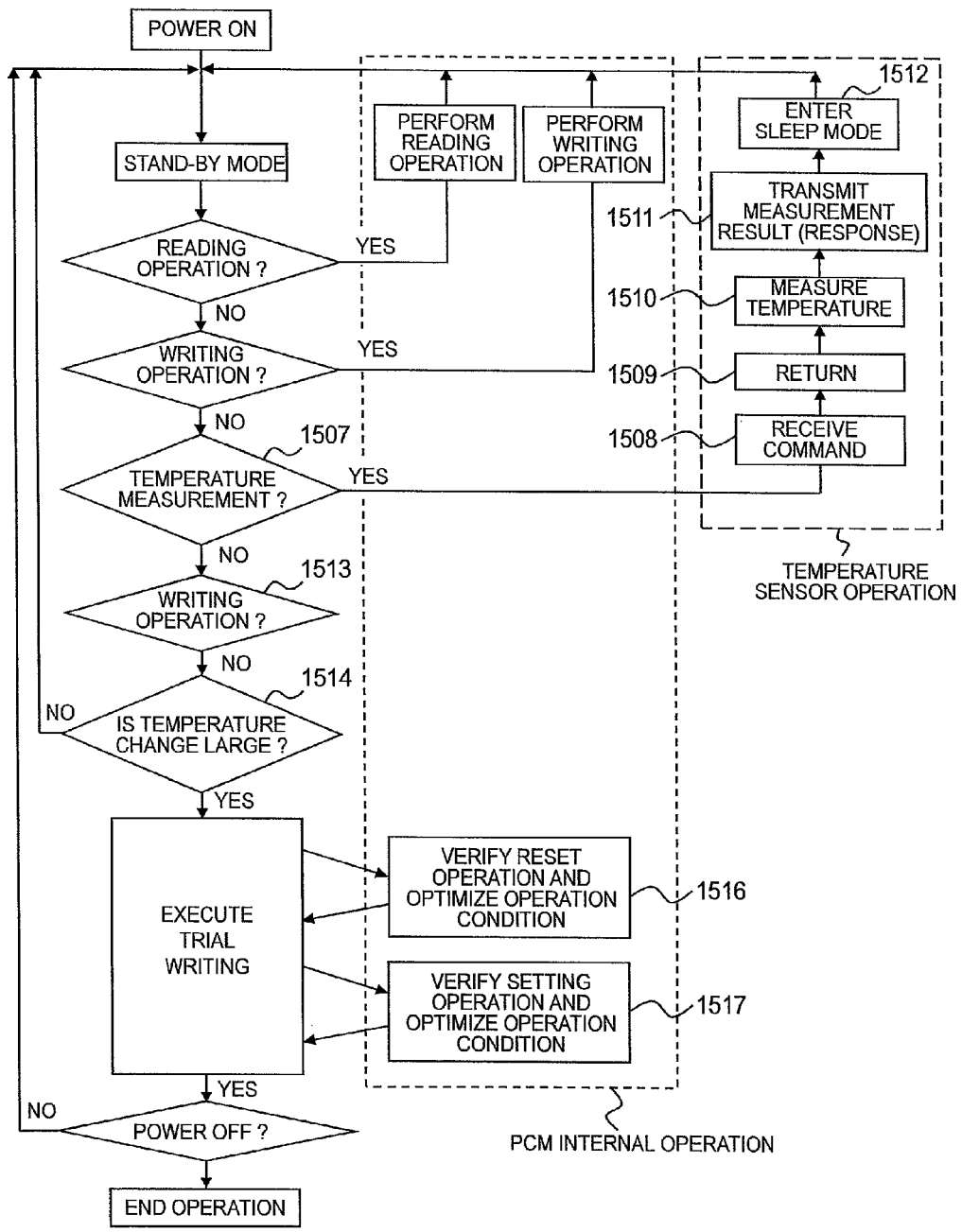
FIG. 15 is a flowchart illustrating an example of a sequence of temperature measurement and a trial writing operation in the phase-change memory system illustrated in FIG. 14.

Referring to FIG. 15, a specific operation is described. First, the SOC issues a sensing command to the temperature sensor TMP positioned near the phase-change memory PCM (1507). The temperature sensor TMP has a portion other than the interface kept in a sleep mode until reception of the sensing command, thereby realizing low power consumption. The temperature sensor TMP that has received the sensing command returns from the sleep mode to sense an ambient temperature, and returns its sensing result to the SOC (1508 to 1511). Then, the portion other than the interface is set in the sleep mode again (1512). The SOC that has received the sensing result detects a temperature change (1513, 1514), and starts a trial write operation similar to that of the first embodiment if necessary (1515 to 1517). Thus, even when the positions of the memory controller MEM_CONT and the phase-change memory PCM are away from each other, optimal writing conditions can be set for the ambient temperature change of the phase-change memory PCM.

Fifth Embodiment

A fifth embodiment is described. In the trial write operations of the first to fourth embodiments, a value of a control factor different from that of the write-verify operation is changed. In other words, in the reset operation, the array voltage VARY which is a control factor of write-verify is uniquely set. In the trial write operation, as illustrated in FIG. 8, driving efficiency of a reset current or a pulse width is changed. However, when the driving efficiency of the reset current or the pulse width changes, an array voltage VARY is accordingly set. The fifth embodiment provides a method for realizing optimal setting of an array voltage VARY.

Figure 16:
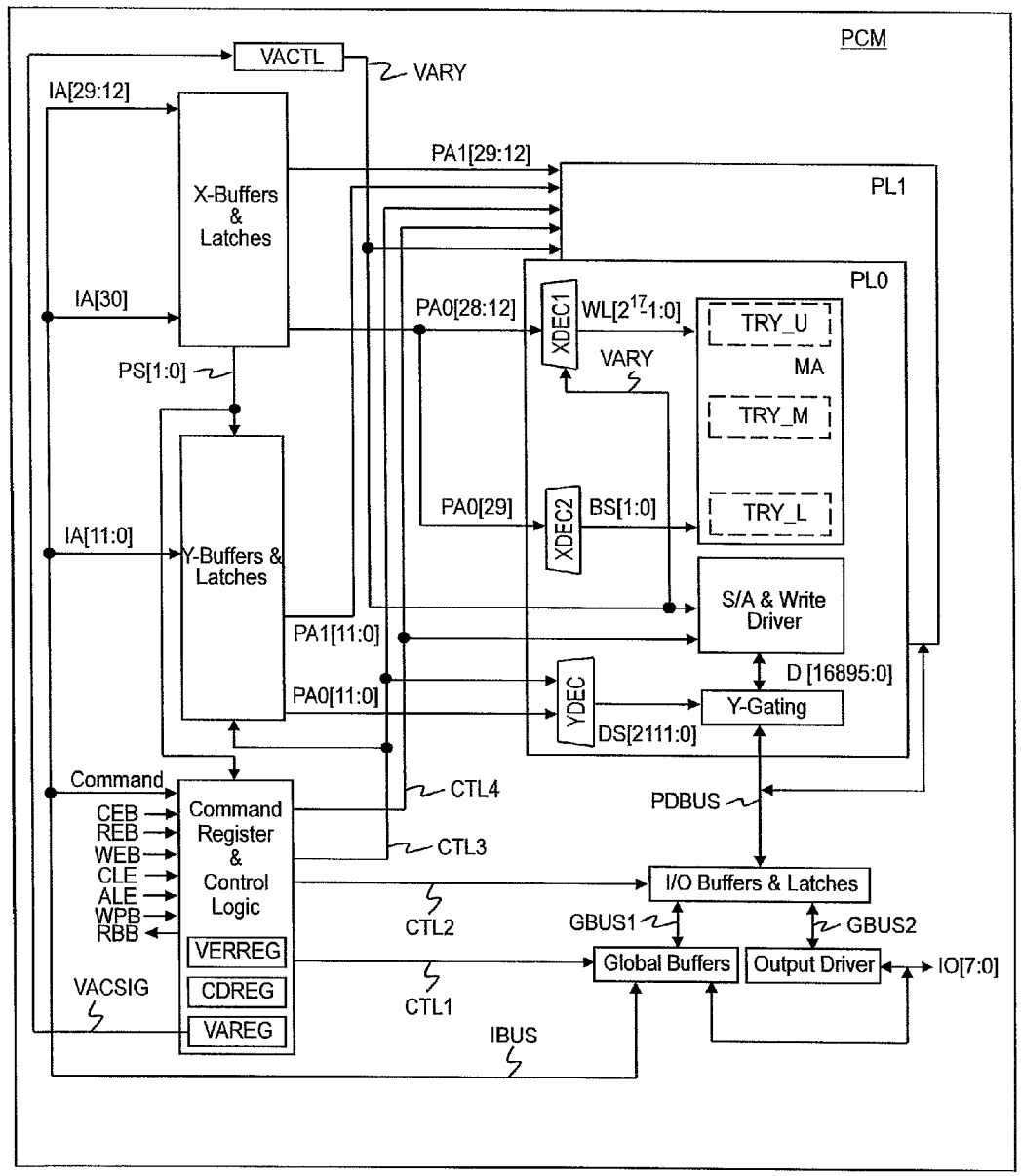
FIG. 16 illustrates an example of an array of phase-change memories in a semiconductor device according to a fifth embodiment of this invention.

FIG. 16 is a block diagram illustrating a main portion circuit of a phase-change memory according to this embodiment. A difference from the configuration of FIG. 2 is addition of an array voltage setting register VAREG to a command register and a control logic (Command Register & Control Logic) and that an array voltage control circuit VACTL having an array voltage control signal VACSIG input as an output signal of the array voltage setting register VAREG. A value of the array voltage setting register VAREG is set according to values of a verify-reading cycle register VERREG and a condition set register CDREG. This configuration enables surer realization of a writing operation.

A step size of the array voltage control circuit VACTL does not have to be fixed, but can be set to different values between a trial write operation and a normal operation. For example, in the trial write operation, voltages are finely set to 0.2 volts or less, preferably 0.1 volts or less, to accurately obtain an operation voltage which changes a resistance value. Then, in a write-verify operation of the normal operation, if writing is performed at a slightly smaller number of steps, for example, while increasing voltages by 0.3 volts after verifying, the cycle of verify-readings can be reduced. This control enables shortening of writing time.

The embodiments of this invention have been described. Various changes can be made without departing from the spirit and scope of this invention. For example, the central processing unit CPU and the memory controller MEM_CONT may be formed on different chips, and the memory controller MEM_CONT and the phase-change memory PCM may be integrated in one device to configure a so-called solid-state disk (SSD). A controller for controlling a trial writing order may be disposed in the phase-change memory PCM, and an element in the memory array MA illustrated in FIG. 2 may be used for the memory of the management table TABLE. Temporarily building the management table TABLE in a random access memory (RAM) embedded in the SOC enables shortening of reading/writing operation time in the management table. When a larger management table capacity is necessary for more meticulous control, a stand-alone RAM may be added in addition to the embedded RAM.

The memory array MA of FIG. 2 may be formed into a stacked structure to realize a large capacity. In this case, heat history varies from one layer to another during manufacturing, and hence a re-write area TRY may be disposed for each layer to change a writing condition for each layer.

In the embodiments described above, the operation conditions and the ambient temperature are monitored one by one, and optimal operation conditions are set according to the management table. However, monitoring contents are not limited to these. For example, by setting an area for counting the number of writing operations in the memory cell in the management table of FIG. 1, and obtaining optimal operation conditions according to the number of additional writing operations via the controller, new writing operation conditions can be set. This control enables realization of a more reliable phase-change memory system. If an expression used for obtaining the optimal operation conditions is stored in the phase-change memory PCM, a management table enlargement caused by such function addition can be suppressed. In the description of the first embodiment, the re-write areas TRY_U, TRY_M, and TRY_L are fixed. But this invention is not limited to this fixed arrangement. For example, if trial writing is performed by using an area having no user information written therein, the memory can be used more efficiently.

The trial writing control is performed between the SOC and the phase-change memory PCM. However, a range of trial writing control is not limited to this. Nowadays, most information terminals are coupled to the Internet. Thus, by sending information obtained by trial writing to a specific data center by the controller CONT, control can be performed by using the specific data center as a master. For example, if the data center is run by a chip vendor, optimal operation conditions and failure information obtained from clients are analyzed, and all the users can be notified of a trial write command before failures of shipped chips spread. In this way, the user can prevent unexpected failures, thereby building a highly reliable memory system. The controller CONT can read trial writing information transmitted from another memory system to the specific data center to use it for determining own writing conditions. Thus, for example, information of another phase-change memory PCM manufactured in the same wafer lot can be obtained to build a more reliable memory system.

What is claimed is:

1. A semiconductor device comprising:
   a memory device including a plurality of memory cells;
   a controller including an address replacement circuit and issuing commands to the memory device; and
   a central processing unit,
   wherein when the controller fails writing to one of the memory cells, the address replacement circuit stores an address of that memory cell as a defect address, and
   wherein in a period of no access from the central processing unit to the memory device, the controller performs writing to the memory cell with the defect address, and removes the address of the memory cell as a defect address if the writing is successful.

2. The semiconductor device according to claim 1, further comprising:
   a verify-reading cycle register storing a cycle of verify-readings when the controller performs writing to the memory cell with the defect address,
   wherein the controller judges that the writing is successful if the cycle of verify-readings is smaller than a predetermined number.

3. The semiconductor device according to claim 1, further comprising:
   a flag indicating whether the writing is successful or not.

4. The semiconductor device according to claim 1,
   wherein the memory cells have a high resistance state and a low resistance state, and
   wherein conditions of the writing are determined for a case of setting the memory cells in the high resistance state and a case of setting the memory cells in the low resistance state.

5. The semiconductor device according to claim 4,
   wherein each memory cell has a phase change element,
   wherein the phase change element has an amorphous state when the memory cell is in the high resistance state, and
   wherein the phase change element has a crystalline state when the memory cell is the low resistance state.

* * * * *